(12) United States Patent
Hishiki

(10) Patent No.: US 10,344,210 B2
(45) Date of Patent: Jul. 9, 2019

(54) LUMINESCENT SUBSTANCE PARTICLE HAVING PEROVSKITE-TYPE STRUCTURE

(71) Applicant: NGK Insulators, Ltd., Nagoya (JP)

(72) Inventor: Tatsuya Hishiki, Nagoya (JP)

(73) Assignee: NGK Insulators, Ltd., Nagoya (JP)

(*) Notice: Subject to any disclaimer, the term of this patent is extended or adjusted under 35 U.S.C. 154(b) by 0 days.

(21) Appl. No.: 15/659,929

(22) Filed: Jul. 26, 2017

(65) Prior Publication Data

US 2017/0321119 A1 Nov. 9, 2017

Related U.S. Application Data

(63) Continuation of application No. PCT/JP2016/052268, filed on Jan. 27, 2016.

(30) Foreign Application Priority Data

| Jan. 28, 2015 | (JP) | ................. | 2015-014041 |
| Aug. 4, 2015 | (JP) | ................. | 2015-153965 |
| Oct. 1, 2015 | (JP) | ................. | 2015-195950 |

(51) Int. Cl.
| C09K 11/66 | (2006.01) |
| C09K 11/00 | (2006.01) |
| C09K 11/08 | (2006.01) |
| H01L 31/055 | (2014.01) |
| C01F 11/02 | (2006.01) |
| C01G 19/02 | (2006.01) |
| C22C 19/05 | (2006.01) |

(52) U.S. Cl.
CPC ............ *C09K 11/663* (2013.01); *C01F 11/02* (2013.01); *C01G 19/02* (2013.01); *C09K 11/00* (2013.01); *C09K 11/08* (2013.01); *C09K 11/66* (2013.01); *H01L 31/055* (2013.01); *C01P 2002/34* (2013.01); *C22C 19/05* (2013.01); *Y02E 10/52* (2013.01)

(58) Field of Classification Search
CPC ....... C09K 11/66; C09K 11/663; C09K 11/00; C09K 11/08; C01F 11/02; C01G 19/02; H01L 31/055
USPC .................................................. 252/301.4 R
See application file for complete search history.

(56) References Cited

U.S. PATENT DOCUMENTS

| 8,128,839 | B2 * | 3/2012 | Xu .......................... F21K 2/04 252/301.4 R |
| 2011/0163657 | A1 | 7/2011 | Okui et al. |
| 2011/0210658 | A1 | 9/2011 | Pan et al. |

FOREIGN PATENT DOCUMENTS

| JP | 2003-218379 A1 | 7/2003 |
| JP | 3698215 B2 | 9/2005 |
| JP | 2007-146102 A1 | 6/2007 |
| JP | 2013-004806 A1 | 1/2013 |
| JP | 2013-518797 A1 | 5/2013 |

OTHER PUBLICATIONS

A.S. Deepa, et al., "Structural and Optical Characterization of BaSnO$_3$ Nanopowder Synthesized through a Novel Combustion Technique," *Journal of Alloys and Compounds*, vol. 509, No. 5, Feb. 3, 2011, pp. 1830-1835.
Extended European Search Report (Application No. 16743395.2) dated Jul. 10, 2018.
Hiroshi Mizoguchi, Patrick M. Woodward, Cheol-Hee Park, and Doublas A. Keszler, "Strong Near-Infrared Luminescence in BaSnO$_3$," *J. Am. Chem. Soc.*, 2004, 126, pp. 9796-9800.
Yosuke Ohya, Yuichiro Kuroki, Tomoichiro Okamoto, and Masasuke Takata, "Influence of Composition in Near-infrared Luminescence of BaSn$_x$O$_3$," Abstract 3L10, Annual Meeting 2014, *The Ceramic Society of Japan* (with partial English translation thereof).
Takafumi Sasaki, "Supercritical Hydrothermal Synthesis of Organic-Inorganic Hybrid Nanoparticles for Medical Use," Doctoral Dissertation in Tohoku University, 2008, pp. 42-51 (with partial English translation thereof).
Wanjun Wang, et al., "Microwave Hydrothermal Synthesis of MSnO$_3$ (M$^{2+}$=Ca$^{2+}$, Sr$^{2+}$, Ba$^{2+}$): Effect of M$^{2+}$ on Crystal Structure and Photocatalytic Pproperties," *J. Mater. Sci.*, vol. 49 (2014), pp. 1893-1902.
Tomoichiro Okamoto, et al., "Study on Near-Infrared Emission Mechanism of BaSnxO$_3$," Proceedings of the 28th Fall Meeting of the Ceramic Society of Japan, 2015 (Published on Sep. 1, 2015) (with partial English translation thereof).
International Search Report and Written Opinion (Application No. PCT/JP2016/052268) dated Feb. 23, 2016.

* cited by examiner

*Primary Examiner* — Edward M Johnson
(74) *Attorney, Agent, or Firm* — Burr & Brown, PLLC

(57) ABSTRACT

A luminescent substance particle including BaSnO$_3$ having a perovskite-type structure, wherein the luminescent substance particle contains one of 0.07% by mass or less of Fe (iron), 0.005% by mass or less of Cr (chromium) and 0.02% by mass or less of Ni (nickel). A wavelength conversion film including the luminescent substance particle for converting a light in an ultraviolet region to a light in an infrared region. A wavelength conversion device including a substrate and the wavelength conversion film formed on the substrate.

18 Claims, 12 Drawing Sheets

LUMINESCENT SUBSTANCE PARTICLE HAVING PEROVSKITE-TYPE STRUCTURE

CROSS-REFERENCE TO RELATED APPLICATIONS

This application is a Continuation of International Application No. PCT/JP2016/052268 filed on Jan. 27, 2016, which is based upon and claims the benefit of priority from Japanese Patent Applications No. 2015-014041 filed on Jan. 28, 2015, No. 2015-153965 filed on Aug. 4, 2015 and No. 2015-195950 filed on Oct. 1, 2015, the contents all of which are incorporated herein by reference.

BACKGROUND OF THE INVENTION

Field of the Invention

The present invention relates to a luminescent substance particle (fine fluorescent particles) of a perovskite-type oxide and a method for producing the luminescent substance particle (process for producing fine fluorescent particles), and relates to a luminescent substance film (thin fluorescent film), a wavelength conversion film, a wavelength conversion device, and a solar battery (solar cell) using the luminescent substance particle.

Description of the Related Art

Japanese Patent No. 3698215 discloses a basic concept that in order to improve power generation efficiency of a solar battery, a part of a solar light is wavelength-converted to generate a light with a longer wavelength, at which the solar battery has a higher spectral sensitivity. Non-Patent Document 1 and Japanese Laid-Open Patent Publication No. 2007-146102 disclose a material having a wavelength conversion function, and Japanese Laid-Open Patent Publication No. 2013-004806 discloses a solar battery having a wavelength conversion layer. Furthermore, Non-Patent Document 2 discloses an effect of a feed composition on a light emission property of a $BaSn_xO_3$.

PRIOR ART DOCUMENTS

Non-Patent Documents

Non-Patent Document 1: Hiroshi Mizoguchi, Patrick M. Woodward, Cheol-Hee Park, and Douglas A. Keszler, "Strong Near-Infrared Luminescence in $BaSnO_3$", J. Am. Chem. Soc., 2004, 126, 9796-9800

Non-Patent Document 2: Yosuke Ohya, Yuichiro Kuroki, Tomoichiro Okamoto, and Masasuke Takata, " Influence of Composition in Near-infrared Luminescence of $BaSn_xO_3$", Abstract 3L10, Annual Meeting 2014, The Ceramic Society of Japan Specifically, Japanese Patent No. 3698215 focuses on a photoactivation property of a rare-earth ion, and teaches a concept that a light energy is wavelength-converted and then transmitted to thereby a photoelectric conversion portion to achieve a solar battery light-receiving element with a high efficiency. This document describes an example of using a rare-earth metal of Eu (europium) or Ce (cerium) in a wavelength conversion material to convert a solar light with a peak wavelength of 370 nm to a light with a peak wavelength of about 410 nm.

Non-Patent Document 1 discloses that $BaSnO_3$ exhibits an emission spectrum of about 800 to 1100 nm under an excitation spectrum of 300 to 400 nm. This document discloses a method containing preparing $BaSn(OH)_6$ via a hydrothermal synthesis and thermally decomposing the $BaSn(OH)_6$ to obtain the $BaSnO_3$. This document is silent about the particle diameter of the $BaSnO_3$, but discloses a crystallite size of 100 to 350 nm. Furthermore, this document discloses that there is no relationship between the particle diameter and light emission intensity.

Japanese Laid-Open Patent Publication No. 2007-146102 describes a luminescent substance of an inorganic oxide prepared by doping a matrix (to be described later) with a rare-earth element and/or a transition metal element. The matrix is composed of an oxide of an alkaline-earth metal and Sn, represented by $ASnO_3$ or $A_{n+1}Sn_nO_{3n+1}$ (wherein A is one, two, or more alkaline-earth metal elements selected from the group consisting of Mg, Ca, Sr, and Ba, and n is 1 or 2). This document discloses a general idea that a luminescent substance is used in a photoelectric conversion element, a photoelectric conversion device, or the like. This document does not disclose data pertaining to wavelength conversion of $BaSnO_3$, or the shape and particle diameter of the $BaSnO_3$. This document discloses a solid-phase reaction (a method containing burning a raw material mixture) as a production method.

Japanese Laid-Open Patent Publication No. 2013-004806 discloses a solar battery having a surface protective layer as the outermost layer, a wavelength conversion layer, and a sealant resin layer, formed on the light-receiving surface of each cell of the battery. The surface protective layer transmits a light in a short wavelength region of 350 nm or less. The wavelength conversion layer is disposed just below the surface protective layer. The wavelength conversion layer contains a wavelength conversion material, which absorbs a light in the short wavelength region of 350 nm or less and has a light emission wavelength in a longer wavelength region.

Non-Patent Document 2 discloses that the luminescence of the $BaSn_xO_3$ (0.8≤x≤1.6) exhibits a peak at the near-infrared region wavelength of 890 nm, and exhibits the maximum light emission intensity when the feed composition ratio x of Sn to Ba is 1.3.

SUMMARY OF THE INVENTION

However, the wavelength conversion material of Japanese Patent No. 3698215 exhibits only a small wavelength shift amount of about 40 nm, and is disadvantageous in that the wavelength conversion performance is low.

Non-Patent Document 1 clarifies that the $BaSnO_3$ exhibits an emission spectrum of about 800 to 1100 nm under an excitation spectrum of 300 to 400 nm, and thus exhibits a large wavelength shift amount. Although it is preferred that the wavelength conversion component does not inhibit visible light transmission, Non-Patent Document 1 does not consider the visible light transmission.

The materials of Japanese Patent No. 3698215 and Japanese Laid-Open Patent Publication No. 2007-146102 contain a rare-earth element, and therefore result in high production costs disadvantageously.

The wavelength conversion layer of Japanese Laid-Open Patent Publication No. 2013-004806 contains an organic material. Therefore, the position of the wavelength conversion layer is limited. For example, the wavelength conversion layer cannot be formed on the outermost surface of the solar battery.

Japanese Patent No. 3698215, Japanese Laid-Open Patent Publication No. 2007-146102, and Non-Patent Documents 1 and 2 do not disclose internal quantum efficiencies. Japanese Laid-Open Patent Publication No. 2013-004806 discloses the internal quantum efficiencies of a blue light emitting component BaMgAl$_{10}$O$_{17}$:Eu (BAM) and a green light emitting component BaMgAl$_{10}$O$_{17}$:Eu,Mn (BAM,Mn). However, this document is silent on the internal quantum efficiency of the BaSnO$_3$.

In view of the future trends, for example, there is a demand for improving power generation efficiency of a solar battery not only by increasing the wavelength shift amount, but also by increasing the transparency and preventing the reduction of the internal quantum efficiency. Furthermore, it will be necessary to reduce the production cost. In view of the above problems, an object of the present invention is to provide a luminescent substance particle and a production method thereof having the following advantageous effects:
(a-1) the wavelength shift amount can be increased;
(a-2) the transparency can be increased, and the reduction of the internal quantum efficiency can be prevented; and
(a-3) the power generation efficiency of a solar battery or the like can be improved, and the production cost can be reduced.

Another object of the present invention is to provide a luminescent substance film, a wavelength conversion film, and a wavelength conversion device having the following advantageous effects:
(b-1) the wavelength shift amount can be increased; and
(b-2) the transparency can be increased, the power generation efficiency of a solar battery or the like can be improved, and the production cost can be reduced.

A further object of the present invention is to provide a solar battery that uses the luminescent substance particle, the wavelength conversion film, or the wavelength conversion device to have the following advantageous effects:
(c-1) the power generation efficiency can be increased; and
(c-2) the mounting position of the wavelength conversion film or a component having a wavelength conversion function can be arbitrarily selected, and thus the design flexibility can be increased.

[1] According to a first aspect of the present invention, there is provided a luminescent substance particle comprising BaSnO$_3$ having a perovskite-type structure, wherein the luminescent substance particle contains Fe (iron), a content of Fe being 0.07% by mass or less. The Fe content is preferably 0.03% by mass or less, more preferably 0.005% by mass or less.

[2] According to a second aspect of the present invention, there is provided a luminescent substance particle comprising BaSnO$_3$ having a perovskite-type structure, wherein the luminescent substance particle contains Cr (chromium), a content of Cr being 0.005% by mass or less. The Cr content is preferably 0.002% by mass or less, more preferably 0.0004% by mass or less.

[3] According to a third aspect of the present invention, there is provided a luminescent substance particle comprising BaSnO$_3$ having a perovskite-type structure, wherein the luminescent substance particle contains Ni (nickel), a content of Ni being 0.02% by mass or less. The Ni content is preferably 0.004% by mass or less, more preferably 0.0007% by mass or less.

[4] In the first to third aspects, the luminescent substance particle has a particle diameter of 100 nm or less.

[5] According to a fourth aspect of the present invention, there is provided a method for producing the luminescent substance particle of the first aspect. The method includes the step of carrying out a reaction of a Ba (barium) source and a Sn (tin) source. In the method, 0.435% by mole or less of Fe is added to 100% by mole of Sn in the Sn source, and at least Fe is not eluted from an apparatus used for the reaction. The added Fe amount per 100% by mole of Sn in the Sn source is preferably 0.187% by mole or less, more preferably 0.031% by mole or less.

[6] According to a fifth aspect of the present invention, there is provided a method for producing the luminescent substance particle of the second aspect. The method includes the step of carrying out a reaction of a Ba (barium) source and a Sn (tin) source. In the method, 0.041% by mole or less of Cr is added to 100% by mole of Sn in the Sn source, and at least Cr is not eluted from an apparatus used for the reaction. The added Cr amount per 100% by mole of Sn in the Sn source is preferably 0.017% by mole or less, more preferably 0.003% by mole or less.

[7] According to a sixth aspect of the present invention, there is provided a method for producing the luminescent substance particle of the third aspect. The method includes the step of carrying out a reaction of a Ba (barium) source and a Sn (tin) source. In the method, 0.091% by mole or less of Ni is added to 100% by mole of Sn in the Sn source, and at least Ni is not eluted from an apparatus used for the reaction. The added Ni amount per 100% by mole of Sn in the Sn source is preferably 0.018% by mole or less, more preferably 0.003% by mole or less.

[8] In the fourth to sixth aspects, the step of carrying out the reaction is preferably performed by a plasma synthesis process.

[9] In the fourth to sixth aspects, the step of carrying out the reaction is preferably performed by a microwave hydrothermal synthesis process.

[10] In the fourth to sixth aspects, the step of carrying out the reaction is preferably performed by a supercritical hydrothermal synthesis process using a titanium alloy container.

[11] In the fourth to sixth aspects, the step of carrying out the reaction is preferably performed by a spray pyrolysis synthesis process.

[12] According to a seventh aspect of the present invention, there is provided a luminescent substance film including the luminescent substance particle of the first to third aspects or the luminescent substance particle produced by the method of the fourth to sixth aspects.

[13] According to an eighth aspect of the present invention, there is provided a wavelength conversion film for converting a light in the ultraviolet region to a light in the infrared region, including the luminescent substance particle of the first to third aspects or the luminescent substance particle produced by the method of the fourth to sixth aspects.

[14] According to a ninth aspect of the present invention, there is provided a wavelength conversion film obtained by dispersing the luminescent substance particle of the first to third aspects or the luminescent substance particle produced by the method of the fourth to sixth aspects in a liquid phase and then applying the liquid phase.

[15] In this case, the liquid phase may contain a compound for forming a siloxane bond, and may be hardened while incorporating the luminescent substance particle therein.

[16] According to a tenth aspect of the present invention, there is provided a wavelength conversion device including a substrate and the wavelength conversion film of the eighth or ninth aspect formed on the substrate.

[17] In this case, the substrate may be a flexible resin sheet or a composite sheet containing a resin and an inorganic material.

[18] According to an eleventh aspect of the present invention, there is provided a solar battery including, in at least one component of the solar battery, the luminescent substance particle of the first to third aspects or the luminescent substance particle produced by the method of the fourth to sixth aspects.

[19] According to a twelfth aspect of the present invention, there is provided a solar battery including the wavelength conversion film of the eighth or ninth aspect formed on a front surface or a rear surface of at least one component of the solar battery.

[20] According to a thirteenth aspect of the present invention, there is provided a solar battery including the wavelength conversion device of the tenth aspect disposed between a plurality of components of the solar battery or on a light incident surface thereof.

The luminescent substance particle and the luminescent substance particle production method of the present invention are capable of increasing the wavelength shift amount, increasing the transparency, preventing the reduction of the internal quantum efficiency, and for example, improving the power generation efficiency of the solar battery.

The luminescent substance film, the wavelength conversion film, and the wavelength conversion device of the present invention are capable of increasing the wavelength shift amount, and for example, improving the power generation efficiency of the solar battery.

The solar battery of the present invention uses the luminescent substance particle, the wavelength conversion film, or the wavelength conversion device, and thereby can exhibit an improved power generation efficiency. In addition, in the solar battery, the position of the wavelength conversion film or a component having a wavelength conversion function can be arbitrarily selected, and thus the design flexibility can be increased.

DESCRIPTION OF EMBODIMENTS

Several embodiments of luminescent substance particles, a luminescent substance particle production method, a luminescent substance film, a wavelength conversion film, a wavelength conversion device, and a solar battery of the present invention will be described below with reference to FIGS. 1 to 12. It should be noted that, in this description, a numeric range of "A to B" includes both the numeric values A and B as the lower limit and upper limit values.
(Luminescent Substance Particle)

A luminescent substance particle according to a first embodiment (hereinafter referred to as the first luminescent substance particle) has $BaSnO_3$ having a perovskite-type structure, and contains 0.07% by mass or less of Fe (iron). The Fe content is preferably 0.03% by mass or less, more preferably 0.005% by mass or less.

A luminescent substance particle according to a second embodiment (hereinafter referred to as the second luminescent substance particle) has $BaSnO_3$ having a perovskite-type structure, and contains 0.005% by mass or less of Cr (chromium). The Cr content is preferably 0.002% by mass or less, more preferably 0.0004% by mass or less.

A luminescent substance particle according to a third embodiment (hereinafter referred to as the third luminescent substance particle) has $BaSnO_3$ having a perovskite-type structure, and contains 0.02% by mass or less of Ni (nickel). The Ni content is preferably 0.004% by mass or less, more preferably 0.0007% by mass or less.

Figure 1:
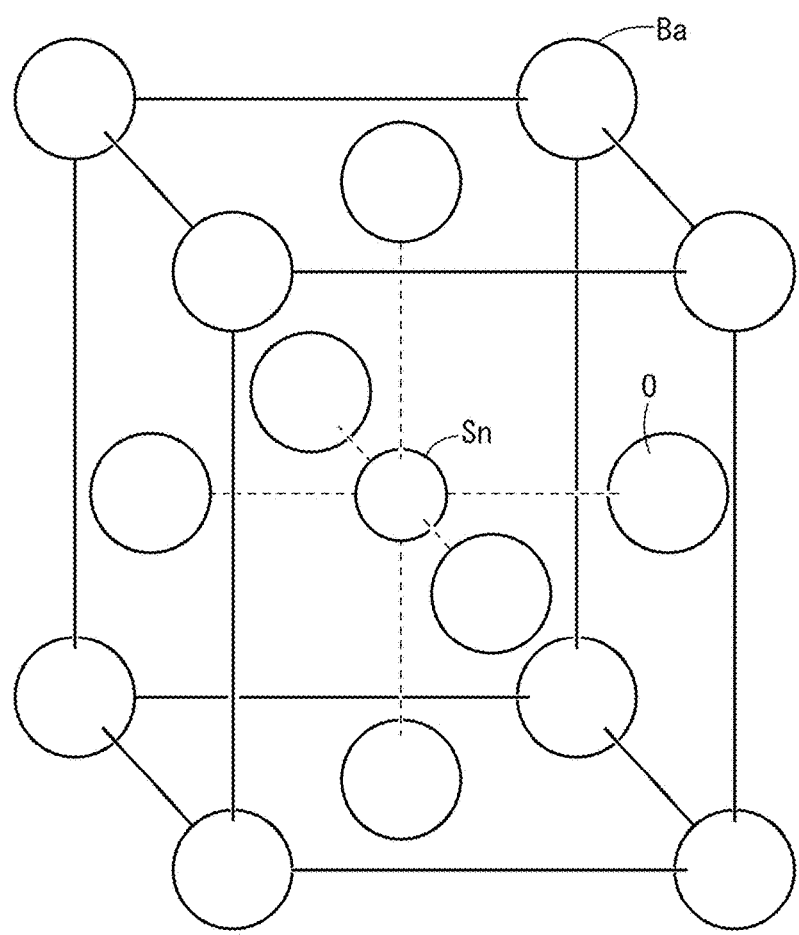
FIG. 1 is a view for illustrating a crystal structure of luminescent substance particles according to first to third embodiments of the present invention.

The first to third luminescent substance particles have a perovskite-type crystal structure shown in FIG. 1. In the crystal structure, the Ba (barium) atoms are located at the corner positions, the Sn (tin) atom is located at the body center position, and the O (oxygen) atoms are located at the face center positions around the body center Sn. Fe, Cr or Ni may be incorporated into the perovskite-type crystal structure at either a substitutional site or interstitial site.

A method for producing the first to third luminescent substance particles contains a process of carrying out a reaction of a Ba (barium) source and a Sn (tin) source.

In production of the first luminescent substance particle, it is preferred that 0.435% by mole or less of Fe is added to 100% by mole of Sn (material) in the Sn source. In this case, the reduction of the internal quantum efficiency is prevented. The Fe amount is preferably 0.187% by mole or less, more preferably 0.031% by mole or less, per 100% by mole of Sn in the Sn source. From the viewpoint of preventing the reduction of the internal quantum efficiency, it is preferred that at least Fe is not eluted from an apparatus for the reaction. It is more preferred that Fe and Cr are not eluted from the apparatus, and it is further preferred that Fe, Cr, and Ni are not eluted from the apparatus.

In production of the second luminescent substance particle, it is preferred that 0.041% by mole or less of Cr is added to 100% by mole of Sn in the Sn source. In this case, the reduction of the internal quantum efficiency is prevented. The Cr amount is preferably 0.017% by mole or less, more preferably 0.003% by mole or less, per 100% by mole of Sn in the Sn source. From the viewpoint of preventing the reduction of the internal quantum efficiency, it is preferred that at least Cr is not eluted from the apparatus for the reaction. It is more preferred that Cr and Fe are not eluted from the apparatus, and it is further preferred that Cr, Fe, and Ni are not eluted from the apparatus.

In production of the third luminescent substance particle, it is preferred that 0.091% by mole or less of Ni is added to 100% by mole of Sn in the Sn source. In this case, the reduction of the internal quantum efficiency is prevented. The Ni amount is preferably 0.018% by mole or less, more preferably 0.003% by mole or less, per 100% by mole of Sn in the Sn source. From the viewpoint of preventing the reduction of the internal quantum efficiency, it is preferred that at least Ni is not eluted from the apparatus for the reaction. It is more preferred that Ni and Fe are not eluted from the apparatus, and it is further preferred that Ni, Fe, and Cr are not eluted from the apparatus.

In the method for producing the first to third luminescent substance particles, for example, the process of carrying out the reaction may be a plasma synthesis process, a microwave hydrothermal synthesis process, a supercritical hydrothermal synthesis process using a titanium alloy container, a spray pyrolysis synthesis process, etc.

In the plasma synthesis process, a $BaCO_3$ powder is used as the Ba source, and a $SnO_2$ powder is used as the Sn source, in such a manner that the amount of Sn is equivalent to the amount of Ba by mole. The sources and ethanol are added into an agate mortar, and the sources are ground and mixed until the mixture loses fluidity due to evaporation of the ethanol. Then, the resultant is dried by a dryer or the like to thereby obtain a mixture powder as a starting material for the plasma synthesis. The mixture powder is introduced into a plasma chamber at a high temperature to thereby produce a $BaSnO_3$ particle powder.

In the microwave hydrothermal synthesis process, $Ba(OH)_2$ is used as the Ba source, and a $SnO_2$ sol is used as the Sn source. The sources and an appropriate amount of water are added together with a stirrer chip made of TEFLON (trademark) into a pressure-resistant resin container having an inner coating of TEFLON (trademark), and the container is sealed. The inside of the container is heated to 270° C. by irradiating with a microwave at a maximum output of 600 W while stirring the mixture liquid in the container. The mixture liquid is maintained in the hydrothermal state for at least 10 hours to thereby obtain an aqueous solution containing $BaSnO_3$ particles dispersed. The aqueous solution is subjected to a centrifugation treatment, the supernatant is removed, pure water is added to the resultant, and this is subjected to the centrifugation treatment again. The water addition and the centrifugation treatment are repeated, and the resultant is dried by a dryer to thereby obtain a $BaSnO_3$ particle powder. The Ba source and the Sn source are not limited to the above compounds, and may be selected from chlorides, nitric acid compounds, and the like.

In the supercritical hydrothermal synthesis process using the titanium alloy container, $Ba(OH)_2$ is used as the Ba source, and a $SnO_2$ sol is used as the Sn source. The sources and an appropriate amount of water are added into a pressure-resistant container made of a titanium alloy, and the container is sealed. The mixture is heated to 400° C. by a dryer or the like, and is maintained in the supercritical hydrothermal state for at least 1 hour, to thereby obtain an aqueous solution containing $BaSnO_3$ particles dispersed. The aqueous solution is subjected to a centrifugation treatment, the supernatant is removed, pure water is added to the resultant, and this is subjected to the centrifugation treatment again. The water addition and the centrifugation treatment are repeated, and the resultant is dried by a dryer to thereby obtain a $BaSnO_3$ particle powder. The Ba source and the Sn source are not limited to the above compounds, and may be selected from chlorides, nitric acid compounds, and the like.

In the spray pyrolysis synthesis process, $BaCl_2$ is used as the Ba source, and $SnCl_2$ is used as the Sn source, in such a manner that the amount of Sn is equivalent to the amount of Ba by mole. The sources are dissolved in water to prepare an aqueous solution of a starting material. The aqueous solution is sprayed and introduced into a reaction container at a high temperature to thereby produce a $BaSnO_3$ particle powder. The Ba source and the Sn source are not limited to the above compounds, and may be selected from hydroxides, nitric acid compounds, and the like.

In the spray pyrolysis synthesis process, a salt-assisted spray pyrolysis synthesis may be carried out. The salt-assisted spray pyrolysis synthesis is characterized by the following steps. An inorganic compound of an element other than the elements for the target material particle is dissolved in a solution containing the sources, and this solution is subjected to the spray pyrolysis to thereby prepare an agglomerated particle. The structure of the agglomerated particle is such that a primary particle containing the elements for the target material is located inside the inorganic compound. Then, the inorganic compound is separated from the agglomerated particle to thereby produce the primary particle.

The composition of the luminescent substance particle may be measured by an energy dispersive X-ray analyzer. The crystal structure of the luminescent substance particle may be measured by a powder X-ray diffractometer (XRD). The particle diameter of the luminescent substance particle may be measured by observation using an electron microscope such as a transmission electron microscope (TEM).

The particle diameter of the luminescent substance particle is the diameter of the particle that is not subjected to a secondary treatment such as a grinding treatment or a classification treatment. The average particle diameter may be the average of the particle diameters of the luminescent substance particles contained in the observation area of the electron microscope.

(Luminescent Substance Film)

Figure 2:
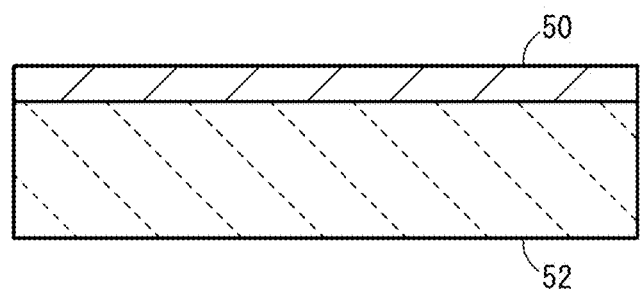
FIG. 2 is a cross-sectional view of a luminescent substance film according to an embodiment of the present invention formed on a substrate.

A luminescent substance film 50 shown in FIG. 2 according to an embodiment of the present invention contains the luminescent substance particle produced by the above production method. The method for forming the luminescent substance film 50 is not particularly limited and may be appropriately selected depending on the intended use, as long as the luminescent substance film 50 contains the luminescent substance particle. For example, the luminescent substance film 50 may be produced by a common method such as a spray method or a dipping method. In FIG. 2, the luminescent substance film 50 is formed on a substrate 52.

(Wavelength Conversion Film)

Figure 3:
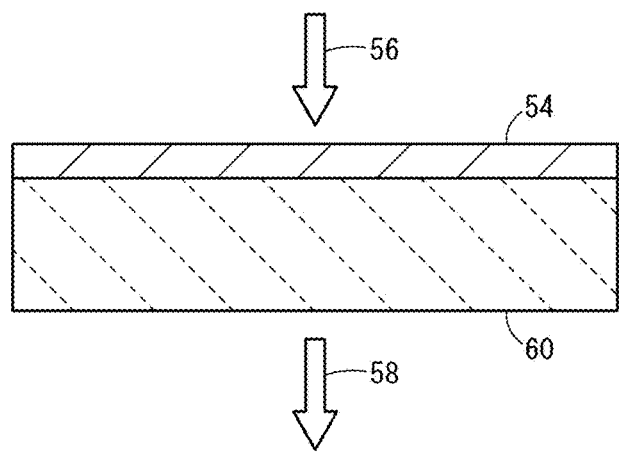
FIG. 3 is a cross-sectional view of a wavelength conversion film according to an embodiment of the present invention formed on a quartz glass.

As shown in FIG. 3, a wavelength conversion film 54 according to an embodiment of the present invention contains the luminescent substance particle produced by the above production method, and acts to convert a light 56 in the ultraviolet region to a light 58 in the infrared region. The wavelength conversion film 54 is formed, e.g., on a surface of a quartz glass 60.

The wavelength conversion film 54 may be produced as follows. Thus, the luminescent substance particles are dispersed in a liquid phase, and application of the dispersion is performed to thereby produce the wavelength conversion film 54.

Figure 4:
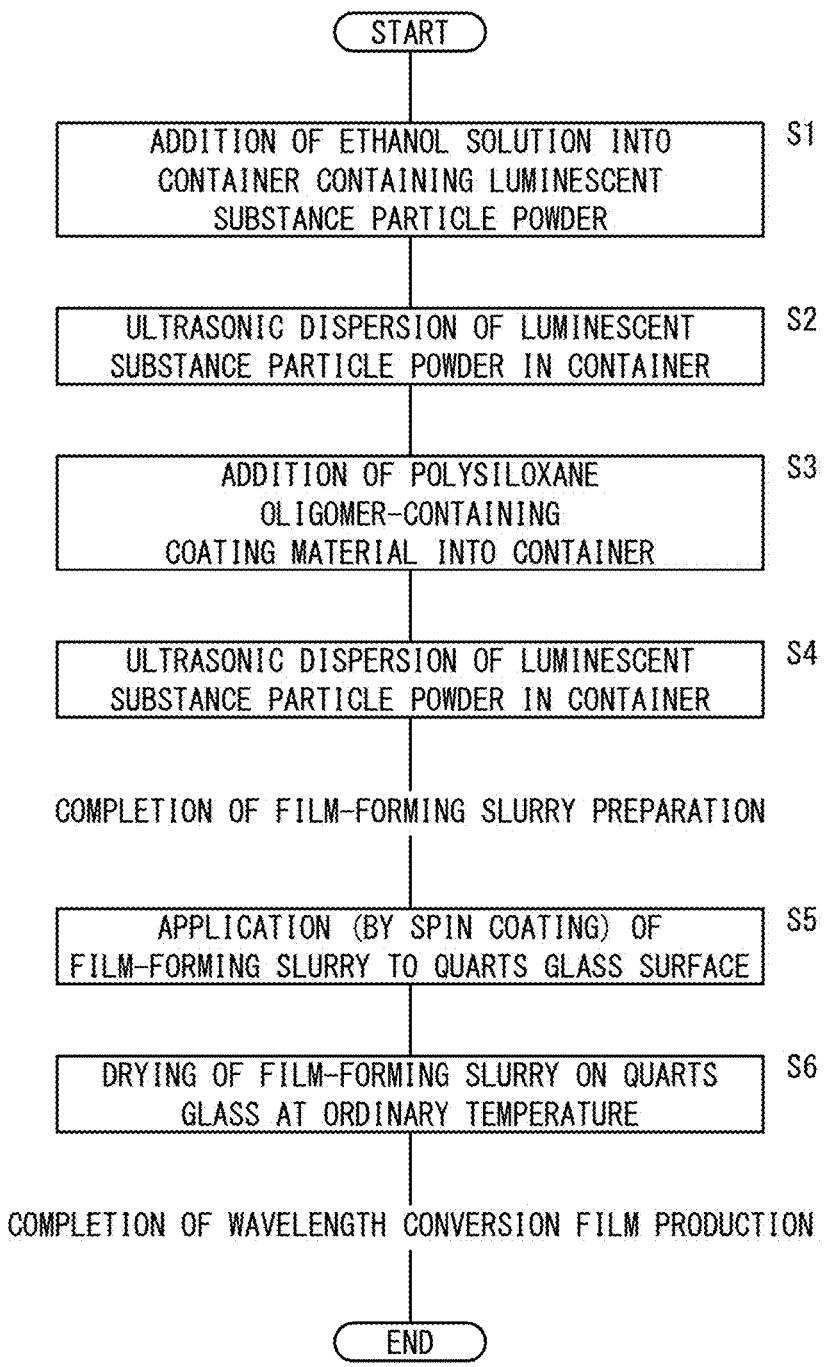
FIG. 4 is a flow chart of an example of a method for producing the wavelength conversion film.

More specifically, in Step S1 of FIG. 4, an ethanol solution is added into a container containing a powder of the luminescent substance particle. In Step S2, the luminescent substance particle powder in the container is ultrasonic-dispersed.

Then, in Step S3, a polysiloxane oligomer-containing coating material, such as GLASCA HP7003 (trade name) available from JSR Corporation, is added to the container. The polysiloxane oligomer-containing coating material is a solution containing a polysiloxane oligomer derived from an alkoxysilane. The solution is applied and dried to thereby form a strong transparent coating having a main skeleton of a siloxane bond network structure —$(Si-O)_n$—.

In Step S4, the luminescent substance particle powder in the container is ultrasonic-dispersed to prepare a film-forming slurry. In Step S5, the film-forming slurry is applied to the surface of the quartz glass 60 or the like. For example, the surface is spin-coated with the film-forming slurry.

In Step S6, the film-forming slurry applied to the quartz glass 60 is dried at ordinary temperature. By such drying, the liquid phase is hardened while incorporating the luminescent substance particle therein. Consequently, a strong wavelength conversion film 54 thus-obtained has the main skeleton of the siloxane bond network structure —$(Si-O)_n$— as described above.

(Wavelength Conversion Device)

Figure 5:
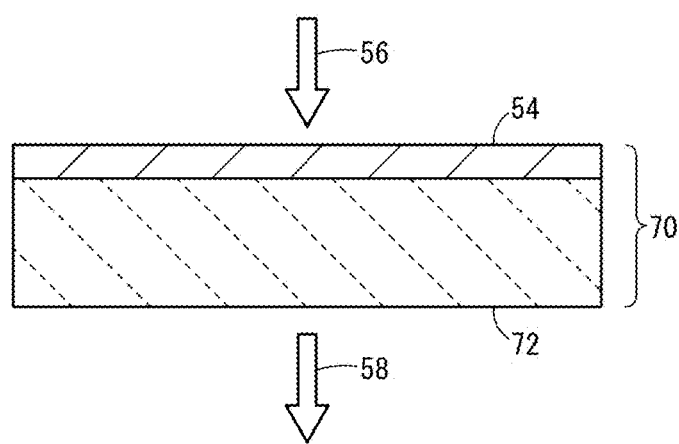
FIG. 5 is a cross-sectional view of a wavelength conversion device according to an embodiment of the present invention.

As shown in FIG. 5, a wavelength conversion device 70 according to an embodiment of the present invention has a substrate 72, and further has the above-described wavelength conversion film 54 formed on one main surface of the substrate 72. As the substrate 72, the above quartz glass 60, a soda glass for a solar battery, etc. may be used. Alternatively, for example, as the substrate 72, a flexible transparent resin sheet, a composite sheet containing a resin and an inorganic material, or the like may be used. In this case, the substrate 72 is preferably a transparent film.

(Solar Cell)

Figure 6:
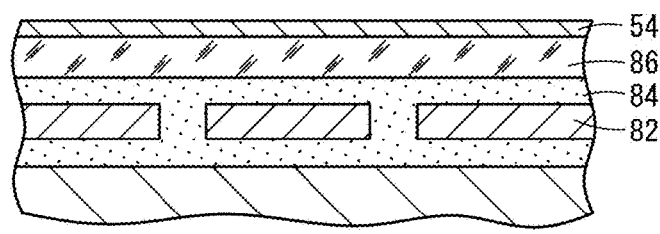
FIG. 6 is a cross-sectional view of a main portion of a solar battery.

As shown in FIG. 6, a main portion of a solar battery 80 according to an embodiment of the present invention has a plurality of power generation cells 82 arranged in a plane, a sealing layer 84 formed so as to cover the power generation cells 82, a glass 86 formed on the sealing layer 84, and the wavelength conversion film 54 formed on a front surface of the glass 86.

For example, the sealing layer 84 may be composed of a light-transmitting sealant resin such as a polyethylene-polyvinyl acetate copolymer (EVA). The sealing layer 84 preferably has a light transmittance of 80% or more in a wavelength region of 200 to 800 nm. The glass 86 is a protection glass, and generally uses a soda glass.

In another example of the solar battery 80 (not shown), the wavelength conversion film 54 may be formed on a front surface or a rear surface of at least one component of the solar battery 80. Alternatively, the wavelength conversion device 70 may be disposed between a plurality of components of the solar battery 80 or on a light incident surface of the solar battery 80.

In general, the wavelength conversion film 54 or the wavelength conversion device 70 may be located between the power generation cells 82 and the solar light incident surface. Incidentally, the glass 86 (the protection glass, generally containing the soda glass) and the sealing layer 84 (containing a resin such as EVA) absorb a part of an ultraviolet light. Therefore, it is more preferred that the wavelength conversion film 54 is arranged closer to the solar light incident surface.

As described above, in Japanese Laid-Open Patent Publication No. 2013-004806, the wavelength conversion layer contains an organic material. Thus, the document gives a suggestion that it is not preferable to form the wavelength conversion layer on the outermost surface exposed to external air. In this embodiment, since the wavelength conversion film 54 is composed of the inorganic material, the wavelength conversion film 54 can be disposed on the outermost surface. Thus, in the present invention, the formation position of the wavelength conversion film 54 or the wavelength conversion device 70 can be arbitrarily selected, and the design flexibility can be increased. In this regard, in Japanese Laid-Open Patent Publication No. 2013-004806, an ultraviolet-transmittable quartz glass is used as a protection glass. However, the quartz glass is highly costly, and therefore cannot be actually used in a solar battery.

EXAMPLES

First Example

XRD patterns of luminescent substance particles of Samples 1 to 18 were evaluated. Furthermore, light emission intensities of the luminescent substance particles of Samples 1 to 18 were evaluated in the fluorescence spectra. Each fluorescence spectrum was obtained by emitting lights with various excitation wavelengths to the luminescent substance particle thereof. Furthermore, effects of Fe or Cr addition on internal quantum efficiency were evaluated.

(Sample 1)

A Ba source and a Sn source were reacted by a plasma synthesis process to thereby produce the luminescent substance particle of Sample 1. In the production of the luminescent substance particle of Sample 1, 5.000% by mole of Fe was added to 1 mol of Sn in the Sn source. The Fe cation addition was carried out in the plasma synthesis process as follows. $Fe(NO_3)_3 \cdot 9H_2O$ was added to and dissolved in ethanol, and a $BaCO_3$ powder and a $SnO_2$ powder were ground and mixed in the ethanol solution as described above, while the Fe amount per 1 mol of Sn in the Sn source is controlled to be a specified mole ratio.

(Sample 2)

The luminescent substance particle of Sample 2 was produced in the same manner as Sample 1 except that 1.000% by mole of Fe was added to 1 mol of Sn in the Sn source.

(Sample 3)

The luminescent substance particle of Sample 3 was produced in the same manner as Sample 1 except that 0.500% by mole of Fe was added to 1 mol of Sn in the Sn source.

(Sample 4)

The luminescent substance particle of Sample 4 was produced in the same manner as Sample 1 except that 0.100% by mole of Fe was added to 1 mol of Sn in the Sn source.

(Sample 5)

The luminescent substance particle of Sample 5 was produced in the same manner as Sample 1 except that 0.050% by mole of Fe was added to 1 mol of Sn in the Sn source.

(Sample 6)

The luminescent substance particle of Sample 6 was produced in the same manner as Sample 1 except that 0.010% by mole of Fe was added to 1 mol of Sn in the Sn source.

(Sample 7)

A Ba source and a Sn source were reacted by a plasma synthesis process to thereby produce the luminescent substance particle of Sample 7. In the production of the luminescent substance particle of Sample 7, 1.000% by mole of Cr was added to 1 mol of Sn in the Sn source. The Cr cation addition was carried out in the plasma synthesis process as follows. $CrCl_3.6H_2O$ was added to and dissolved in ethanol, and a $BaCO_3$ powder and a $SnO_2$ powder were ground and mixed in the ethanol solution as described above, while the Cr amount per 1 mol of Sn in the Sn source is controlled to be a specified mole ratio.

(Sample 8)

The luminescent substance particle of Sample 8 was produced in the same manner as Sample 7 except that 0.100% by mole of Cr was added to 1 mol of Sn in the Sn source.

(Sample 9)

The luminescent substance particle of Sample 9 was produced in the same manner as Sample 7 except that 0.050% by mole of Cr was added to 1 mol of Sn in the Sn source.

(Sample 10)

The luminescent substance particle of Sample 10 was produced in the same manner as Sample 7 except that 0.010% by mole of Cr was added to 1 mol of Sn in the Sn source.

(Sample 11)

The luminescent substance particle of Sample 11 was produced in the same manner as Sample 7 except that 0.005% by mole of Cr was added to 1 mol of Sn in the Sn source.

(Sample 12)

The luminescent substance particle of Sample 12 was produced in the same manner as Sample 7 except that 0.001% by mole of Cr was added to 1 mol of Sn in the Sn source.

(Sample 13)

A Ba source and a Sn source were reacted by a plasma synthesis process to thereby produce the luminescent substance particle of Sample 13. In the production of the luminescent substance particle of Sample 13, 1.000% by mole of Ni was added to 1 mol of Sn in the Sn source. The Ni cation addition was carried out in the plasma synthesis process as follows. $Ni(NO_3)_2.6H_2O$ was added to and dissolved in ethanol, and a $BaCO_3$ powder and a $SnO_2$ powder were ground and mixed in the ethanol solution as described above, while the Ni amount per 1 mol of Sn in the Sn source is controlled to be a specified mole ratio.

(Sample 14)

The luminescent substance particle of Sample 14 was produced in the same manner as Sample 13 except that 0.100% by mole of Ni was added to 1 mol of Sn in the Sn source.

(Sample 15)

The luminescent substance particle of Sample 15 was produced in the same manner as Sample 13 except that 0.050% by mole of Ni was added to 1 mol of Sn in the Sn source.

(Sample 16)

The luminescent substance particle of Sample 16 was produced in the same manner as Sample 13 except that 0.010% by mole of Ni was added to 1 mol of Sn in the Sn source.

(Sample 17)

The luminescent substance particle of Sample 17 was produced in the same manner as Sample 13 except that 0.005% by mole of Ni was added to 1 mol of Sn in the Sn source.

(Sample 18)

The luminescent substance particle of Sample 18 was produced in the same manner as Sample 13 except that 0.001% by mole of Ni was added to 1 mol of Sn in the Sn source.

The details, the Fe, Cr, and Ni contents and the internal quantum efficiencies of Samples 1 to 18 are shown in Tables 1, 2, and 3. Incidentally, the values of high-concentration Samples 1 to 4, 7 to 9, and 13 to 15 were measured values, and the values of low-concentration Samples 5, 6, 10 to 12, and 16 to 18 were estimated values.

TABLE 1

| | Added Fe amount per 100% by mole of Sn in Sn source (% by mole) | Fe content (% by mass) | Internal quantum efficiency (%) |
| --- | --- | --- | --- |
| Sample 1 | 5.000 | 0.80000 | 1 |
| Sample 2 | 1.000 | 0.20000 | 3 |
| Sample 3 | 0.500 | 0.04000 | 14 |
| Sample 4 | 0.100 | 0.02000 | 38 |
| Sample 5 | 0.050 | 0.00804 | 48 |
| Sample 6 | 0.010 | 0.00161 | 51 |

TABLE 2

| | Added Cr amount per 100% by mole of Sn in Sn source (% by mole) | Cr content (% by mass) | Internal quantum efficiency (%) |
| --- | --- | --- | --- |
| Sample 7 | 1.000 | 0.12000 | 1 |
| Sample 8 | 0.100 | 0.02000 | 1 |
| Sample 9 | 0.050 | 0.01000 | 6 |
| Sample 10 | 0.010 | 0.00121 | 36 |
| Sample 11 | 0.005 | 0.00061 | 49 |
| Sample 12 | 0.001 | 0.00012 | 51 |

TABLE 3

| | Added Ni amount per 100% by mole of Sn in Sn source (% by mole) | Ni content (% by mass) | Internal quantum efficiency (%) |
| --- | --- | --- | --- |
| Sample 13 | 1.000 | 0.22000 | 1 |
| Sample 14 | 0.100 | 0.02000 | 7 |
| Sample 15 | 0.050 | 0.01000 | 14 |
| Sample 16 | 0.010 | 0.00220 | 40 |

TABLE 3-continued

| | Added Ni amount per 100% by mole of Sn in Sn source (% by mole) | Ni content (% by mass) | Internal quantum efficiency (%) |
|---|---|---|---|
| Sample 17 | 0.005 | 0.00110 | 50 |
| Sample 18 | 0.001 | 0.00022 | 52 |

<Evaluation: XRD Pattern and TEM Microstructure>
(Sample 1)

Figure 7A:
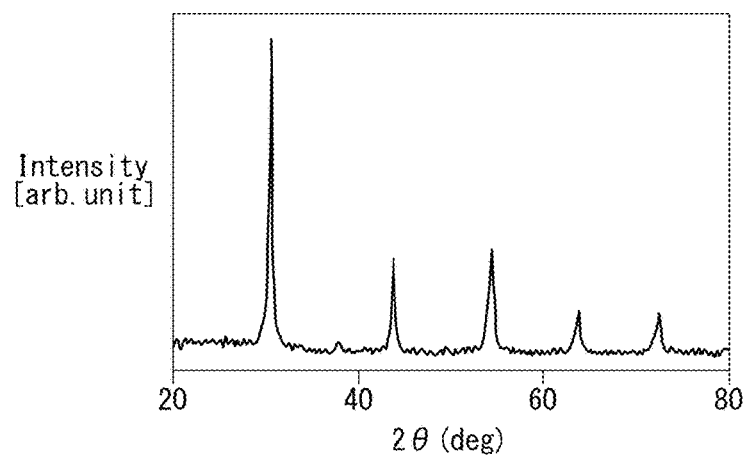
FIG. 7A is an XRD pattern of a luminescent substance particle of Sample 1.
Figure 7B:
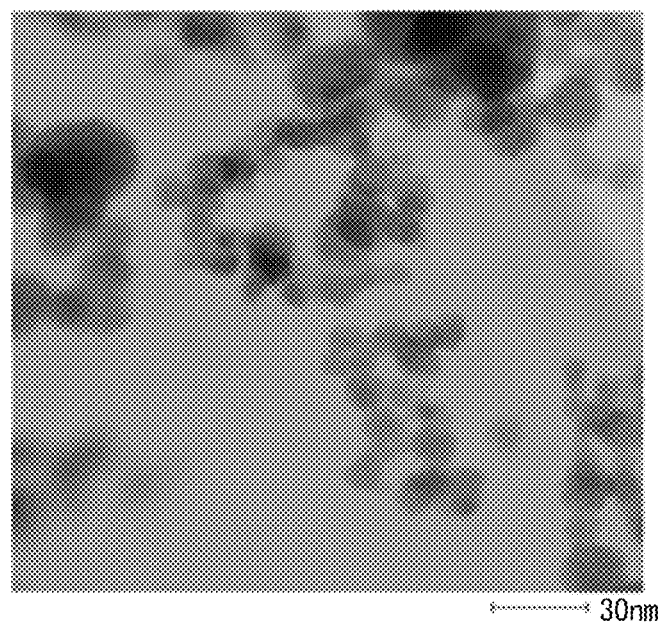
FIG. 7B is a photograph of a microstructure of the luminescent substance particle of Sample 1 taken by a TEM (transmission electron microscope) (hereinafter referred to simply as the TEM microstructure)

A typical XRD pattern of the luminescent substance particle of Sample 1 is shown in FIG. 7A. The XRD pattern is approximately equal to that of the cubic crystal $BaSnO_3$. A TEM microstructure of the luminescent substance particle of Sample 1 is shown in FIG. 7B. As evident from FIG. 7B, it was confirmed that the luminescent substance particles having particle diameters of about 10 to 40 nm were formed.

(Samples 2 to 18)

XRD patterns and TEM microstructures of Samples 2 to 18 were similar to those of Sample 1 (FIGS. 7A and 7B).

<Evaluation: Fe Content>
(Sample 1)

Concerning Fe content, a non-standard semi-quantitative analysis of the obtained fluorescent X-ray spectrum was carried out based on an FP method. As a result, the Fe content was 0.80000% by mass.

(Samples 2 to 4)

The Fe contents of Samples 2, 3, and 4 were 0.20000%, 0.04000%, and 0.02000% by mass, respectively.

(Sample 5)

Figure 8A:
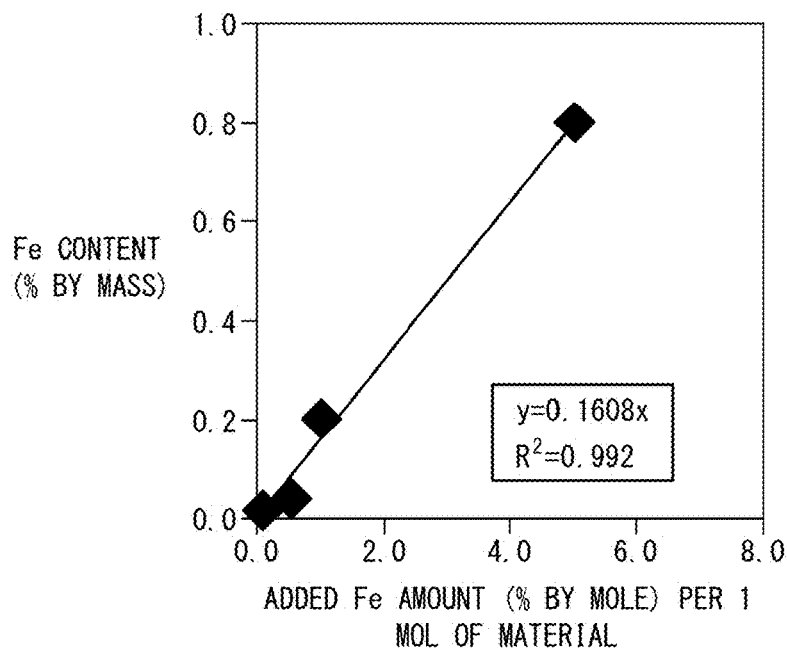
FIG. 8A is a graph showing results of Samples 1 to 4, the x-axis representing added Fe amount (% by mole) per 1 mol of material, and the y-axis representing Fe content (% by mass)

The Fe content was lower than the detection limit of the FP method using the fluorescent X-ray spectrum. Therefore, the Fe content was estimated as follows. As shown in FIG. 8A, the data of Samples 1 to 4 were plotted on an x-y graph. The x-axis represents added Fe amount (% by mole) per 1 mol of Sn in the Sn source, and the y-axis represents Fe content (% by mass). A line equation ($y=0.1608x$, $R^2=0.992$) was obtained from the plotted data by a least-square method, and the Fe content corresponding to the added Fe amount of Sample 5 was determined using the line equation. As a result, the Fe content was 0.00804% by mass.

(Sample 6)

The Fe content of Sample 6 was obtained based on the added Fe amount using the above line equation. As a result, the Fe content was 0.00161% by mass.

<Evaluation: Cr Content>
(Sample 7)

Concerning the Cr content, a non-standard semi-quantitative analysis of the obtained fluorescent X-ray spectrum was carried out based on an FP method. As a result, the Cr content was 0.12000% by mass.

(Samples 8 and 9)

The Cr contents of Samples 8 and 9 were 0.02000% and 0.01000% by mass, respectively.

(Sample 10)

Figure 8B:
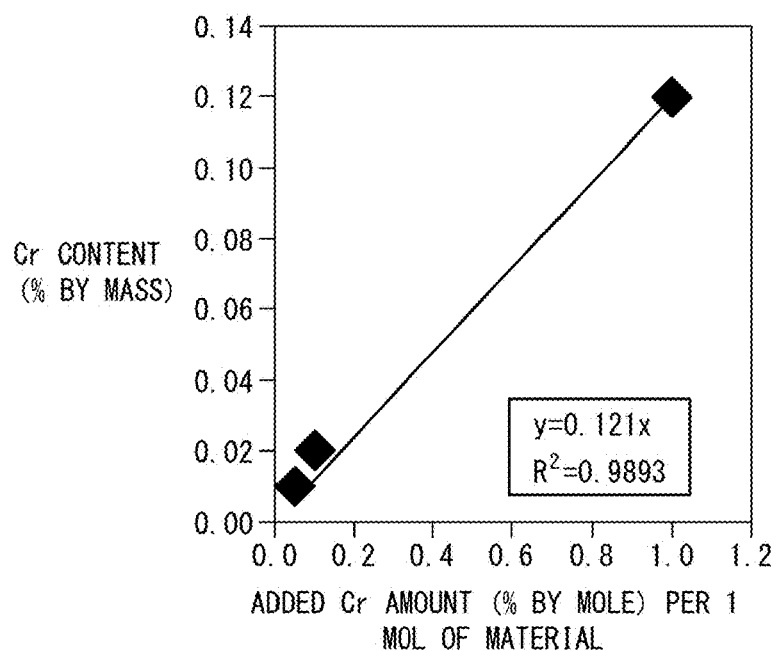
FIG. 8B is a graph showing results of Samples 7 to 9, the x-axis representing added Cr amount (% by mole) per 1 mol of material, and the y-axis representing Cr content (% by mass)

The Cr content was lower than the detection limit of the FP method using the fluorescent X-ray spectrum. Therefore, the Cr content was estimated as follows. As shown in FIG. 8B, the data of Samples 7 to 9 were plotted on an x-y graph. The x-axis represents added Cr amount (% by mole) per 1 mol of Sn in the Sn source, and the y-axis represents Cr content (% by mass). A line equation ($y=0.121x$, $R^2=0.9893$) was obtained from the plotted data by a least-square method, and the Cr content corresponding to the added Cr amount of Sample 10 was determined using the line equation. As a result, the Cr content was 0.00121% by mass.

(Sample 11)

The Cr content of Sample 11 was obtained based on the added Cr amount using the above line equation. As a result, the Cr content was 0.00061% by mass.

(Sample 12)

The Cr content of Sample 12 was obtained based on the added Cr amount using the above line equation. As a result, the Cr content was 0.00012% by mass.

<Evaluation: Ni Content>
(Sample 13)

Concerning Ni content, a non-standard semi-quantitative analysis of the obtained fluorescent X-ray spectrum was carried out based on an FP method. As a result, the Ni content was 0.22000% by mass.

(Samples 14 and 15)

The Ni contents of Samples 14 and 15 were 0.02000% and 0.01000% by mass, respectively.

(Sample 16)

The Ni content was lower than the detectable range of the FP method using the fluorescent X-ray spectrum.

Figure 9:
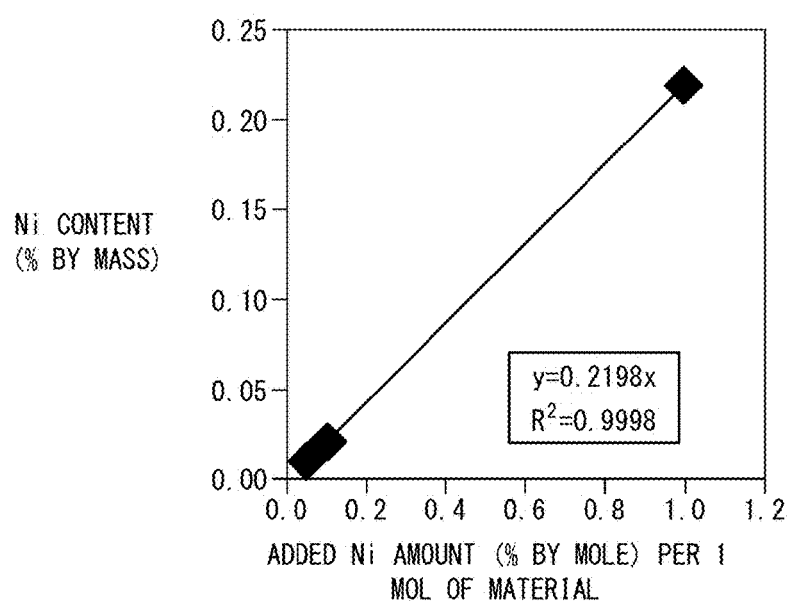
FIG. 9 is a graph showing results of Samples 13 to 15, the x-axis representing added Ni amount (% by mole) per 1 mol of material, and the y-axis representing Ni content (% by mass)

Therefore, the Ni content was estimated as follows. As shown in FIG. 9, the data of Samples 13 to 15 were plotted on an x-y graph. The x-axis represents added Ni amount (% by mole) per 1 mol of Sn in the Sn source, and the y-axis represents Ni content (% by mass). A line equation ($y=0.2198x$, $R^2=0.9998$) was obtained from the plotted data by a least-square method, and the Ni content corresponding to the added Ni amount of Sample 16 was determined using the line equation. As a result, the Ni content was 0.00220% by mass.

(Sample 17)

The Ni content of Sample 17 was obtained based on the added Ni amount using the above line equation. As a result, the Ni content was 0.00110% by mass.

(Sample 18)

The Ni content of Sample 18 was obtained based on the added Ni amount using the above line equation. As a result, the Ni content was 0.00022% by mass.

<Evaluation: Internal Quantum Efficiency>
(Sample 1)

An internal quantum efficiency of a specimen of the luminescent substance particle of Sample 1 (a specimen of Sample 1) was measured by using a spectrofluorophotometer (FP-8600 available from JASCO Corporation) and a ϕ60-mm integrating sphere. In the internal quantum efficiency measurement, the specimen of Sample 1 was irradiated with an excitation light having a wavelength of 360 nm.

Figure 10:
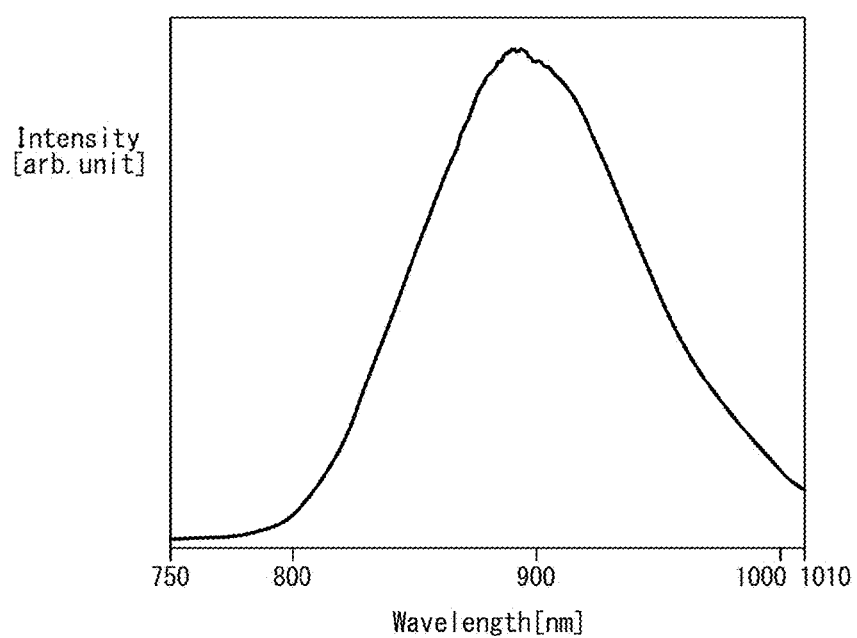
FIG. 10 is a fluorescence spectrum of the luminescent substance particle of Sample 1 under an excitation light with a wavelength of 360 nm.

As shown in FIG. 10, in the internal quantum efficiency measurement, a fluorescence spectrum peak with a center wavelength of approximately 900 nm was observed under the excitation light having the wavelength of 360 nm. The following Samples 2 to 18 exhibited a similar peak.

As a result of the measurement, the specimen of Sample 1 had an internal quantum efficiency of 1%.

(Samples 2 to 6)

The internal quantum efficiencies of the luminescent substance particle specimens of Samples 2 to 6 were measured in the same manner as Sample 1. As a result, Samples 2, 3, 4, 5, 6 had internal quantum efficiencies of 3%, 14%, 38%, 48%, 51%, respectively.

(Samples 7 to 12)

The internal quantum efficiencies of the luminescent substance particle specimens of Samples 7 to 12 were measured in the same manner as Sample 1. As a result, Samples 7, 8, 9, 10, 11, 12 had internal quantum efficiencies of 1%, 1%, 6%, 36%, 49%, 51%, respectively.

<Evaluation: Fe, Cr, and Ni Contents per 1 mol of Material (Sn)>

Figure 11:
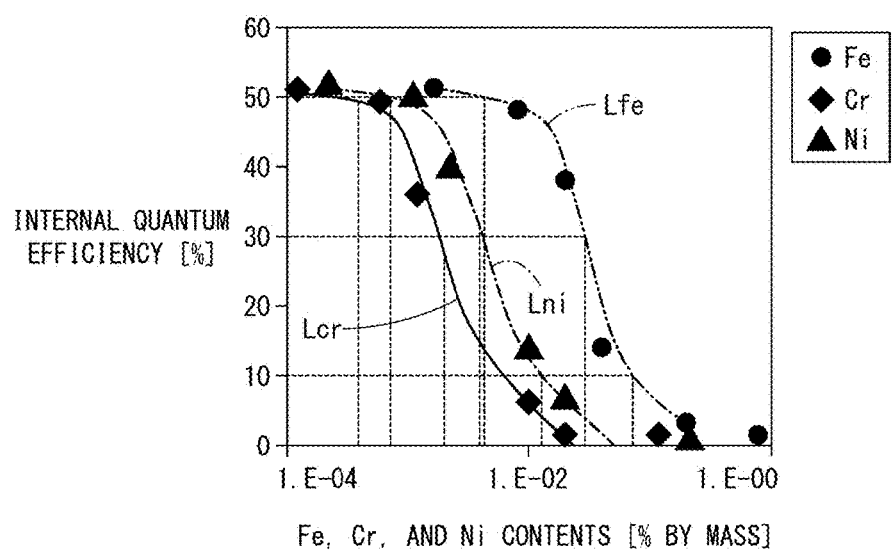
FIG. 11 is a graph showing changes of internal quantum efficiency with Fe, Cr, and Ni contents based on results of Samples 1 to 18, wherein the Fe, Cr, and Ni content values of less than 0.01% by mass are outside the detectable range, and therefore the values are estimated from the approximate lines of FIGS. 8A, 8B, and 9.

Changes of internal quantum efficiency with the Fe, Cr, and Ni contents were plotted based on the results of Samples 1 to 18, as shown in FIG. 11. In FIG. 11, the changes with the Fe content are represented by circles ●, the changes with the Cr content are represented by diamonds ♦, and the changes with the Ni content are represented by triangles ▲.

In FIG. 11, the curve Lfe is a characteristic curve representing the internal quantum efficiency changes with the Fe content, the curve Lcr is a characteristic curve representing the internal quantum efficiency changes with the Cr content, and the curve Lni is a characteristic curve representing the internal quantum efficiency changes with the Ni content.

Based on the characteristic curves Lfe, Lcr, and Lni, the internal quantum efficiency of 50% was considered as the maximum performance, and the internal quantum efficiency of 10% was considered as the minimum performance required for achieving an output increase effect. In addition, the internal quantum efficiency of 30% was considered as an intermediate level between 50% and 10%.

Furthermore, three threshold values of Fe content corresponding to the three internal quantum efficiencies of 10%, 30%, and 50% were read from the characteristic curve Lfe. Similarly, three threshold values of Cr content were read from the characteristic curve Lcr, and three threshold values of Ni content were read from the characteristic curve Lni. The results are shown in Table 4.

TABLE 4

|  | First threshold value | Second threshold value | Third threshold value |
|---|---|---|---|
| Internal quantum efficiency | >10% | >30% | >50% |
| Fe content | 0.0700% by mass or less | 0.0300% by mass or less | 0.0050% by mass or less |
| Cr content | 0.0050% by mass or less | 0.0020% by mass or less | 0.0004% by mass or less |
| Ni content | 0.0200% by mass or less | 0.0040% by mass or less | 0.0007% by mass or less |

Furthermore, the added Fe amounts (feed mole ratios) corresponding to the three threshold values of Fe content were determined using the line equation ($y=0.1608x$, $R^2=0.992$) shown in FIG. 8A.

The added Cr amounts (feed mole ratios) corresponding to the three threshold values of Cr content were determined using the line equation ($y=0.121x$, $R^2=0.9893$) shown in FIG. 8B.

The added Ni amounts (feed mole ratios) corresponding to the three threshold values of Ni content were determined using the line equation ($y=0.2198x$, $R^2=0.9998$) shown in FIG. 9. The results are shown in Table 5.

TABLE 5

| Additive element | Content (% by mass) | Added element amount (% by mole) per 100% mole of Sn in Sn source |
|---|---|---|
| Fe | 0.0700 | 0.435 |
|  | 0.0300 | 0.187 |
|  | 0.0050 | 0.031 |
| Cr | 0.0050 | 0.041 |
|  | 0.0020 | 0.017 |
|  | 0.0004 | 0.003 |

TABLE 5-continued

| Additive element | Content (% by mass) | Added element amount (% by mole) per 100% mole of Sn in Sn source |
|---|---|---|
| Ni | 0.0200 | 0.091 |
|  | 0.0040 | 0.018 |
|  | 0.0007 | 0.003 |

As shown in Table 5, from the viewpoint of increasing the internal quantum efficiency, it is clear that, in terms of the composition of the luminescent substance particle, the Fe content should be 0.0700% by mass or less, preferably 0.0300% by mass or less, more preferably 0.0050% by mass or less. In terms of the feed amount, the Fe amount should be 0.435% by mole or less, preferably 0.187% by mole or less, more preferably 0.031% by mole or less, per 1 mol of Sn in the Sn source.

Similarly, it is clear that, in terms of the composition of the luminescent substance particle, the Cr content should be 0.0050% by mass or less, preferably 0.0020% by mass or less, more preferably 0.0004% by mass or less. In terms of the feed amount, the Cr amount should be 0.041% by mole or less, preferably 0.017% by mole or less, more preferably 0.003% by mole or less, per 1 mol of Sn in the Sn source.

Similarly, it is clear that, in terms of the composition of the luminescent substance particle, the Ni content should be 0.0200% by mass or less, preferably 0.0040% by mass or less, more preferably 0.0007% by mass or less. In terms of the feed amount, the Ni amount should be 0.091% by mole or less, preferably 0.018% by mole or less, more preferably 0.003% by mole or less, per 1 mol of Sn in the Sn source.

Second Example (Solar Battery)

Electric power generation amount differences were confirmed between Comparative Examples 1 to 4 and Examples 1 to 10. Furthermore, electric power generation amount increases with respect to Comparative Example 1 were confirmed in Comparative Examples 2 to 4 and Examples 1 to 10.

Example 1

The structure of the solar battery 80 shown in FIG. 6 was used in Example 1. More specifically, a solar battery of Example 1 has a plurality of the power generation cells 82 arranged in a plane, the sealing layer 84 formed so as to cover the power generation cells 82, the glass 86 formed on the sealing layer 84, and the wavelength conversion film 54 formed on a surface of the glass 86. The luminescent substance particle contained in the wavelength conversion film 54 was prepared as follows. A Ba source and a Sn source were reacted by a plasma synthesis process, 0.500% by mole of Fe being added to 1 mol of Sn in the Sn source in the same manner as Sample 3. The luminescent substance particle had a Fe content of 0.04000% by mass.

Example 2

A solar battery of Example 2 was produced in the same manner as Example 1 except that the luminescent substance particle in the wavelength conversion film 54 was prepared by adding 0.010% by mole of Fe to 1 mol of Sn in the Sn source as in Sample 6. The luminescent substance particle had a Fe content of 0.00161% by mass.

Example 3

A solar battery of Example 3 was produced in the same manner as Example 1 except that the luminescent substance particle in the wavelength conversion film 54 was prepared by adding 0.010% by mole of Cr to 1 mol of Sn in the Sn source as in Sample 10. The luminescent substance particle had a Cr content of 0.00121% by mass.

Example 4

A solar battery of Example 4 was produced in the same manner as Example 1 except that the luminescent substance particle in the wavelength conversion film 54 was prepared by adding 0.001% by mole of Cr to 1 mol of Sn in the Sn source as in Sample 12. The luminescent substance particle had a Cr content of 0.00012% by mass.

Example 5

A solar battery of Example 5 was produced in the same manner as Example 1 except that the luminescent substance particle in the wavelength conversion film 54 was prepared by adding 0.010% by mole of Ni to 1 mol of Sn in the Sn source as in Sample 16. The luminescent substance particle had a Ni content of 0.00220% by mass.

Example 6

A solar battery of Example 6 was produced in the same manner as Example 1 except that the luminescent substance particle in the wavelength conversion film 54 was prepared by adding 0.001% by mole of Ni to 1 mol of Sn in the Sn source as in Sample 18. The luminescent substance particle had a Ni content of 0.00022% by mass.

Example 7

A solar battery of Example 7 was produced in the same manner as Example 1 except that the luminescent substance particle in the wavelength conversion film 54 was prepared as follows. A Ba source and a Sn source were reacted by a plasma synthesis process, none of Fe, Cr, and Ni being added to 1 mol of Sn in the Sn source.

Example 8

A solar battery of Example 8 was produced in the same manner as Example 1 except that the luminescent substance particle in the wavelength conversion film 54 was prepared as follows. A Ba source and a Sn source were reacted by a microwave hydrothermal synthesis process, none of Fe, Cr, and Ni being added to 1 mol of Sn in the Sn source.

Example 9

A solar battery of Example 9 was produced in the same manner as Example 1 except that the luminescent substance particle in the wavelength conversion film 54 was prepared as follows. A Ba source and a Sn source were reacted by a supercritical hydrothermal synthesis process using a titanium alloy container, none of Fe, Cr, and Ni being added to 1 mol of Sn in the Sn source.

Example 10

A solar battery of Example 10 was produced in the same manner as Example 1 except that the luminescent substance particle in the wavelength conversion film 54 was prepared as follows. A Ba source and a Sn source were reacted by a spray pyrolysis synthesis process, none of Fe, Cr, and Ni being added to 1 mol of Sn in the Sn source.

Comparative Example 1

Figure 12:
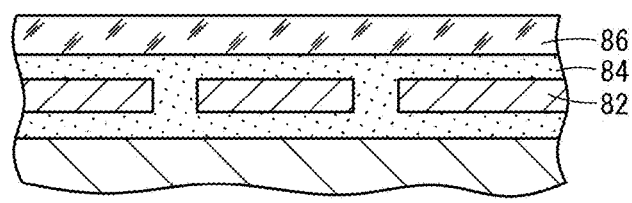
FIG. 12 is a cross-sectional view of a main portion of a solar battery according to Comparative Example 1.

As shown in FIG. 12, a solar battery of Comparative Example 1 has a plurality of the power generation cells 82 arranged in a plane, the sealing layer 84 formed on the power generation cells 82, and the glass 86 formed on the sealing layer 84.

Comparative Example 2

A solar battery of Comparative Example 2 was produced in the same manner as Example 1 except that the luminescent substance particle in the wavelength conversion film 54 was prepared by adding 1.000% by mole of Fe to 1 mol of Sn in the Sn source as in Sample 2. The luminescent substance particle had a Fe content of 0.20000% by mass.

Comparative Example 3

A solar battery of Comparative Example 3 was produced in the same manner as Example 1 except that the luminescent substance particle in the wavelength conversion film 54 was prepared by adding 0.050% by mole of Cr to 1 mol of Sn in the Sn source as in Sample 9. The luminescent substance particle had a Cr content of 0.01000% by mass.

Comparative Example 4

A solar battery of Comparative Example 4 was produced in the same manner as Example 1 except that the luminescent substance particle in the wavelength conversion film 54 was prepared by adding 0.100% by mole of Ni to 1 mol of Sn in the Sn source as in Sample 14. The luminescent substance particle had a Ni content of 0.02198% by mass.

(Evaluation)

The details, the internal quantum efficiencies, and the power generation amounts (mW/cm$^2$) of Comparative Examples 1 to 4 and Examples 1 to 10 are shown in Table 6.

Furthermore, the output increases (%) of Comparative Examples 2 to 4 and Examples 1 to 10 are shown in Table 6. For example, the output increase of Example 1 was calculated by the equation: (power generation amount of Example 1—power generation amount of Comparative Example 1)/power generation amount of Comparative Example 1. In the item "Luminescent substance particle production method" in Table 6, the term "Plasma" means the method containing the plasma synthesis process, the term "Microwave" means the method containing the microwave hydrothermal synthesis process, the term "Supercritical" means the method containing the supercritical hydrothermal synthesis process using the titanium alloy container, and the term "Spray" means the method containing the spray pyrolysis synthesis process.

TABLE 6

| | Luminescent substance particle production method | Additive element | Added element amount per 100% by mole of Sn in Sn source (% by mole) | Internal quantum efficiency (%) | Power generation amount (mW/cm$^2$) | Output increase (%) |
|---|---|---|---|---|---|---|
| Comp. Ex. 1 | No luminescent substance particle No wavelength conversion film | | | | 12.20 | 0 |
| Comp. Ex. 2 | Plasma | Fe | 1.000 | 3 | 12.10 | −0.8 |
| Comp. Ex. 3 | Plasma | Cr | 0.050 | 6 | 12.20 | 0.0 |
| Comp. Ex. 4 | Plasma | Ni | 0.100 | 7 | 12.20 | 0.0 |
| Ex. 1 | Plasma | Fe | 0.500 | 14 | 12.45 | 2.0 |
| Ex. 2 | Plasma | Fe | 0.010 | 51 | 13.35 | 9.4 |
| Ex. 3 | Plasma | Cr | 0.010 | 36 | 13.00 | 6.6 |
| Ex. 4 | Plasma | Cr | 0.001 | 51 | 13.30 | 9.0 |
| Ex. 5 | Plasma | Ni | 0.010 | 40 | 13.10 | 7.4 |
| Ex. 6 | Plasma | Ni | 0.001 | 52 | 13.35 | 9.4 |
| Ex. 7 | Plasma | Not added | — | 53 | 13.45 | 10.2 |
| Ex. 8 | Microwave | Not added | — | 52 | 13.40 | 9.8 |
| Ex. 9 | Supercritical | Not added | — | 52 | 13.35 | 9.4 |
| Ex. 10 | Spray | Not added | — | 53 | 13.45 | 10.2 |

The power generation amounts of Comparative Examples 1, 3, and 4 were 12.20 (mW/cm$^2$). The power generation amount of Comparative Example 2 was smaller than that of Comparative Example 1. In contrast, the power generation amounts of Examples 1 to 10 were larger than that of Comparative Example 1. In particular, as is clear from the results of e.g., Examples 1 and 2, a larger power generation amount was obtained when a smaller amount of Fe was added to the luminescent substance particle contained in the wavelength conversion film 54. This is true also for Cr and Ni (see Examples 3 to 6). That is, a larger power generation amount was obtained when a smaller amount of Cr or Ni was added to the luminescent substance particle contained in the wavelength conversion film 54.

As is clear from the results of Examples 7 to 10, the power generation amount is further increased when none of Fe, Cr, and Ni is added in the process for producing the luminescent substance particle. As is also clear from the results of Examples 7 to 10, for producing the luminescent substance particle, the supercritical hydrothermal synthesis process using the titanium alloy container is preferred, the microwave hydrothermal synthesis process is more preferred, and the plasma synthesis process and the spray pyrolysis synthesis process are most preferred.

The luminescent substance particle, the luminescent substance particle production method, the luminescent substance film, the wavelength conversion film, the wavelength conversion device, and the solar battery of the present invention are not limited to the above-described embodiments, and various changes and modifications may be made therein without departing from the scope of the invention.

What is claimed is:

1. A luminescent substance particle comprising BaSnO$_3$ having a perovskite-type structure, wherein the luminescent substance particle contains Fe, a content of Fe being 0.07% by mass or less, and
wherein an internal quantum efficiency of light emission is 10% or more under excitation spectrum of ultraviolet light.

2. The luminescent substance particle according to claim 1, having a particle diameter of 100 nm or less.

3. A luminescent substance particle comprising BaSnO$_3$ having a perovskite-type structure, wherein the luminescent substance particle contains Cr, a content of Cr being 0.005% by mass or less, and
wherein an internal quantum efficiency of light emission is 10% or more under excitation spectrum of ultraviolet light.

4. The luminescent substance particle according to claim 3, having a particle diameter of 100 nm or less.

5. A luminescent substance particle comprising BaSnO$_3$ having a perovskite-type structure, wherein the luminescent substance particle contains Ni, a content of Ni being 0.02% by mass or less, and
wherein an internal quantum efficiency of light emission is 10% or more under excitation spectrum of ultraviolet light.

6. The luminescent substance particle according to claim 5, having a particle diameter of 100 nm or less.

7. A wavelength conversion film for converting a light in an ultraviolet region to a light in an infrared region, comprising the luminescent substance particle according to claim 1.

8. A wavelength conversion film for converting a light in an ultraviolet region to a light in an infrared region, comprising the luminescent substance particle according to claim 3.

9. A wavelength conversion film for converting a light in an ultraviolet region to a light in an infrared region, comprising the luminescent substance particle according to claim 5.

10. A wavelength conversion device comprising a substrate and the wavelength conversion film according to claim 7 formed on the substrate.

11. A wavelength conversion device comprising a substrate and the wavelength conversion film according to claim 8 formed on the substrate.

12. A wavelength conversion device comprising a substrate and the wavelength conversion film according to claim 9 formed on the substrate.

13. The wavelength conversion device according to claim 10, wherein the substrate is a flexible resin sheet or a composite sheet containing a resin and an inorganic material.

14. The wavelength conversion device according to claim 11, wherein the substrate is a flexible resin sheet or a composite sheet containing a resin and an inorganic material.

15. The wavelength conversion device according to claim 12, wherein the substrate is a flexible resin sheet or a composite sheet containing a resin and an inorganic material.

16. The luminescent substance particle of claim 1, wherein the content of Fe is 0.00161% by mass or more.

17. The luminescent substance particle of claim 3, wherein the content of Cr is 0.00012% by mass or more.

18. The luminescent substance particle of claim 5, wherein the content of Ni is 0.00022% by mass or more.

* * * * *